United States Patent [19]
Okabe et al.

[11] Patent Number: 5,837,154
[45] Date of Patent: Nov. 17, 1998

[54] METHOD OF MANUFACTURING DOUBLE-SIDED CIRCUIT TAPE CARRIER

[75] Inventors: Norio Okabe; Yasuharu Kameyama; Katsutoshi Taga; Takayuki Sato; Mamoru Mita; Hiroki Tanaka; Hiroshi Ishikawa, all of Ibaraki, Japan

[73] Assignee: Hitachi Cable, Ltd., Tokyo, Japan

[21] Appl. No.: 847,753

[22] Filed: Apr. 23, 1997

[30] Foreign Application Priority Data

Apr. 23, 1996 [JP] Japan ..................................... 8-101012
Feb. 20, 1997 [JP] Japan ..................................... 9-036110

[51] Int. Cl.$^6$ ..................................................... B44C 1/22
[52] U.S. Cl. ................................ 216/14; 216/18; 216/56; 216/65
[58] Field of Search .................................. 216/14, 18, 39, 216/41, 56, 65; 257/735; 438/611

[56] References Cited

U.S. PATENT DOCUMENTS 3,823,467  7/1974  Shamash et al. ..................... 216/14 X
4,908,933  3/1990  Sagisaka et al. ..................... 216/14 X

OTHER PUBLICATIONS

Monthly Magazine, "Denshi Zairyo Electronic Materials" Jul. 1989 Translations of pertinent portions on pp. 30, and 31.

Primary Examiner—William Powell
Attorney, Agent, or Firm—McDermott, Will & Emery

[57] ABSTRACT

A method of manufacturing a double-sided circuit tape carrier comprising an insulating film like a polyimide tape, circuit wiring patterns on both sides thereof, and via holes through which at least a part of the circuit wiring patterns on both sides are electrically connected with each other. A copper thin film is patterned by photoetching. Via holes are formed through the insulating film by irradiating a laser beam by using the patterned copper thin film as a mask. Then, a conductive layer of a graphite conductive thin film and a copper plating layer is formed. The copper thin film is patterned by photoetching forming a chip hole and an outer lead hole through the insulating film by irradiating a laser beam. Finally, one of the copper thin films is patterned by photoetching to form circuit wiring pattern.

12 Claims, 9 Drawing Sheets

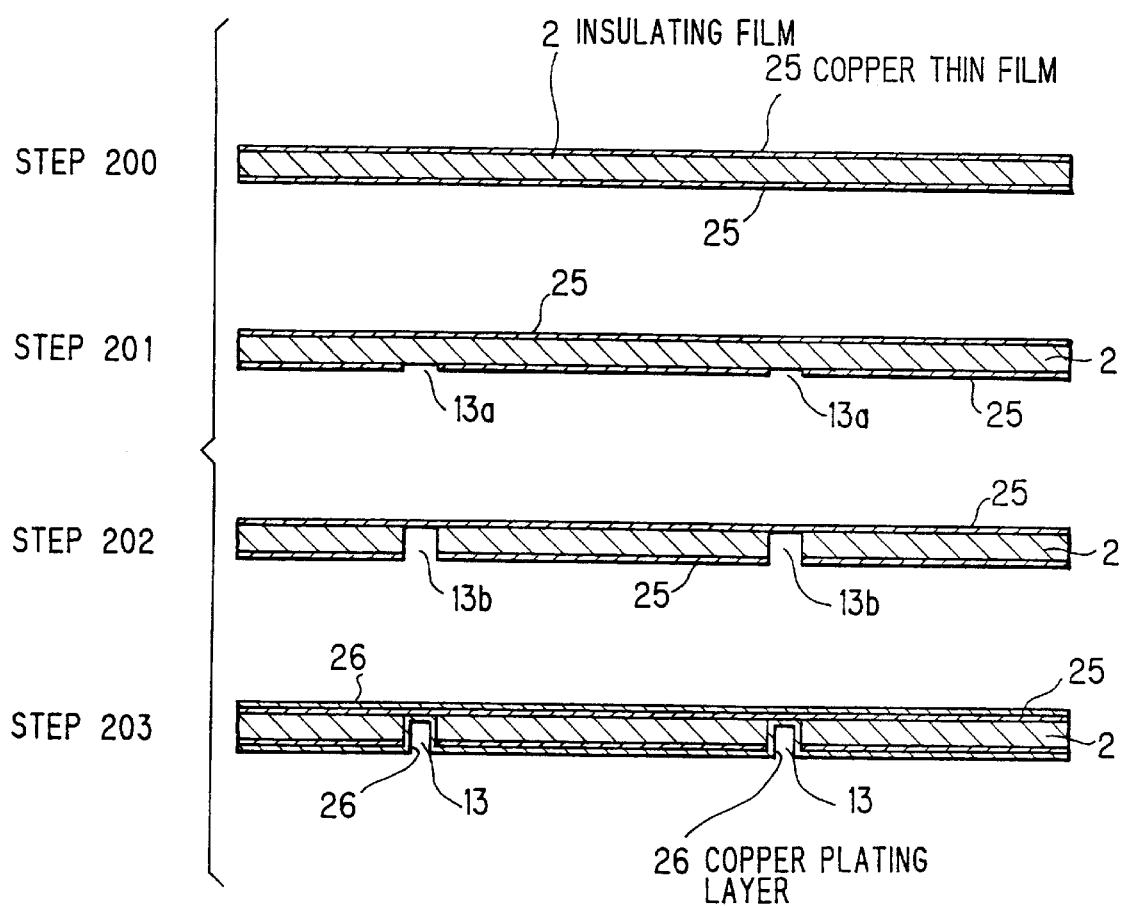

METHOD OF MANUFACTURING DOUBLE-SIDED CIRCUIT TAPE CARRIER

FIELD OF THE INVENTION

This invention relates to a method of manufacturing a double-sided circuit tape carrier, and more particularly to, a method of manufacturing a double-sided circuit tape carrier having a plurality of holes such as via holes and a chip holes through an insulating tape, in which these holes are formed by irradiating a laser beam.

BACKGROUND OF THE INVENTION

A tape automated bonding (TAB) technique is known as a method of mounting a semiconductor chip, i.e., IC-chip, on a tape carrier on which copper circuit wiring patterns are formed, in which a plurality of leads of the circuit wiring patterns are directly connected to bonding pads of the semiconductor chip. This technique has been extensively used because it is more suitable for not only the connection between the narrower-pitched leads and the pads but also a smaller and thinner package of the IC-chip which is know as a tape carrier package (TCP) than a known wire bonding technique. More recently, this technique has been also used for mounting a semiconductor chip on a tape carrier on which ball-shaped soldering pads are provided at grid positions as ball grid arrays (BGA) for electrical connection.

Nowadays, as higher-speed ICs are being developed, a double-sided circuit tape carrier has been demanded to be utilized in order to improve high frequency signal transmission characteristics, or to increase circuit density in accordance with a larger number of leads of the IC.

FIG. 1 and FIG. 2 show a conventional semiconductor device using a double-sided circuit tape carrier. The conventional semiconductor device comprises a double-sided circuit tape carrier 1 and a semiconductor chip 14. The double-sided circuit tape carrier 1 is mainly based on an insulating film 2 like polyimide film. The insulating film 2 is a long carrier tape, through which a plurality of sprockets 3 are provided with a constant space along both edges thereof. Although only one unit of semiconductor device is shown in FIG. 1, a series of semiconductor devices having the same structure are successively formed along the insulating film 2.

The insulating film 2 is provided with a square-shaped chip hole 4 in the center thereof, in which the semiconductor chip 14 is mounted. Moreover, the insulating film 2 is further provided with inner leads 5, ground inner leads 6, outer leads 7, and ground outer leads 8 on one side thereof, and a ground plane layer 9 on the overall surface opposite the one side thereof. Each inner lead 5 is connected to the outer lead 7 directly.

The insulating film 2 is further provided with an outer lead hole 10 under the outer leads 7 and the ground outer leads 8, surrounding the chip hole 4 as a predetermined width of box-shaped slit opening. Moreover, each outer lead 7 and each ground outer lead 8 are connected to wiring patterns 11, respectively.

The ground inner leads 6 and the ground outer leads 8 are selectively positioned among the inner leads 5 and the outer leads 7, respectively. The ground inner leads 6 and the ground outer leads 8 are provided with land 12 at one end thereof, at which via holes 13 are formed through the insulating film 2. The ground inner lead 6 and the ground outer lead 8 are electrically connected to the ground plane layer 9 through the via holes 13.

Next, a conventional method of manufacturing a semiconductor device using the abovementioned double-sided circuit tape carrier will be explained below.

First, the semiconductor chip 14 is properly positioned in the chip hole 4, then each pad (not shown) of the semiconductor chip 14 is electrically connected to the tip of the corresponding inner lead 5 by a bonding tool (not shown). After that, the surface of the semiconductor chip 14 including the connecting portion between the pads (not shown) and the tip portion of the inner leads is covered by a sealing resin 15. Finally, the outer leads 7 and ground outer leads 8 are cut in their certain lengths at the outer lead hole 10 to obtain the semiconductor device.

Next, a conventional method of manufacturing a double-sided circuit tape carrier will be explained by FIGS. 3A and 3B, wherein like parts are indicated by like reference numerals as used in FIGS. 1 and 2.

First, a thin insulating tape 2 like a polyimide tape is prepared (STEP A), and copper thin films 16 are provided over both surfaces thereof by a plating technique like electroless plating (STEP B). Then, the copper thin film 16 on one side of the insulating film 2 is selectively removed by etching like a photoetching technique to form removed portions 4a, 10a and 13b as windows (STEP C). The insulating film 2 is then selectively removed by an etchant like a hydrazine-alkali aqueous solution by using the copper thin film 16 as an etching mask to form a chip hole 4, an outer lead hole 10 and via holes 13 (STEP D). After that, a preliminary copper thin layer 17 is formed on the copper thin film 16 on each side of the insulating film 2, on the bottom surface and side wall of each hole 4, 10 and 13 by the similar electroless plating (STEP E).

Next, as shown in FIG. 3B, the insulating film 2 thus formed is further provided with a patterned thick photoresist layer 18 on each side thereof (STEP F). Then, exposed portions of the preliminary copper thin layers 17 where photoresist layer 18 is not provided are plated by a thick copper plating layer 19 by an electroplating technique to form circuit wiring patterns, which comprise inner leads 5, ground inner leads 6, outer leads 7, ground outer leads 8 and a ground plane layer 9 (STEP G). Finally, after the photoresist layer 18 being removed(STEP H), the copper thin films 16, the preliminary copper thin layers 17 and the copper plating layers 19 are etched by an etchant by a thickness of the copper thin films 16 and the preliminary copper thin layers 17 so that undesired connection among the circuit wiring patterns are disconnected. This is performed by removing the copper thin film 16 and the preliminary copper thin layer 17 between the ground inner lead 6 (the inner lead 5) and the ground outer lead 8 (the outer lead 7), those on the bottom of the chip hole 4 and the outer lead hole 10, and the preliminary copper thin layer 17a and 17b on the wall of the chip hole 4 and the outer lead hole 10 (STEP I).

In the conventional method of manufacturing a double-sided circuit tape carrier, however, there are disadvantage set out below:

(a) the insulating film is selectively removed by alkaline etching to form the chip hole and the outer lead hole. Therefore, the insulating film may be limited to a polyimide film having a certain characteristics which is especially soluble in alkali aqueous solution and has a thickness of less than 50 µm. As a result, the mechanical strength of the double-sided circuit tape carrier tends to be low, which makes it difficult to handle it during the manufacturing process of the double-sided circuit tape carrier or the mounting process of a semiconductor chip, or to ensure accurate dimensions of circuit wiring patterns or the like.

(b) the polyimide film is not easy to be etched to form the via holes, chip hole and outlead hole. These holes tend to have a tapered cross-section toward the bottom. Therefore, it is difficult to form finer via holes to obtain denser circuit wiring patterns. Moreover, the side walls of these holes tend to be excessively etched below the copper thin film layers, which may result in defective connection through the plated via hole, or defective dimensions of these holes.

(c) the conventional method has an environmental problem, because the hydrazine-alkali aqueous solution used for etching the polyimide film is known a strongly poisonous substance.

(d) regarding the electroless plating technique used for making the copper thin layer, the conventional method is inferior in productivity, because not only a complicated preparatory process such as activation by catalyst is necessary but also the rate of electroless deposition is much slower than that of electrodeposition by the electroplating. This may be a major problem when continuous plating is carried out on a running long tape carrier.

(e) the electroless plating solution is less stable, less controllable, and short-lived. Therefore, the deterioration of product quality like a lack of close adhesion may occur due to the changing quality of the copper layer being plated during the process.

SUMMARY OF THE INVENTION

Accordingly, it is an object of the invention to provide a method of manufacturing a double-sided circuit tape carrier of improved characteristics such as mechanical strength, dimension accuracy, circuit wiring density, conductivity through a via hole or the like.

It is a further object of the invention to provide a method of manufacturing a double-sided circuit tape carrier to which insulating films of a wider range of material and thickness are applicable.

It is a still further object of the invention to provide a method of manufacturing a double-sided circuit tape carrier of more simplified steps.

According to the first feature of the invention, a method of manufacturing a double-sided circuit tape carrier, the double sided circuit tape carrier comprising an insulating film, circuit wiring patterns on both sides thereof, and a via hole through which at least a part of the circuit wiring patterns on both sides are electrically connected with each other, the method comprising the steps of:

patterning at least one conductive thin film by photoetching, said conductive thin film being formed on each side of an insulating film;

forming a first hole through the insulating film by irradiating a laser beam by using the patterned conductive thin film as a first mask;

forming a conductive layer on the side wall of the first hole then, patterning one of the conductive thin films by photoetching; forming a second hole through the insulating film by irradiating a laser beam by using the patterned conductive thin film as a second mask; then, patterning one of the conductive thin films by photoetching to form circuit wiring pattern.

Forming a first hole like a via hole through the insulating film by irradiating a laser beam allows insulating films having a wider range of material and thickness to be applied to the method in accordance with the invention. Therefore, mechanical strength, dimension accuracy or the like are improved. The patterned conductive thin film used as a mask prevent the masked portion from being irradiated by the laser beam. As a result, a hole the critical dimensions of which are identical with the removed portion of the patterned conductive thin film. Moreover, the side wall of the hole is almost perpendicular to the surface of the insulating film. As a result, dimension accuracy of the hole and/or fine arrangement thereof are improved.

According to the second feature of the invention, a method of manufacturing a double-sided circuit tape carrier of the similar structure, the method comprising the steps of:

patterning at least one conductive thin film by photoetching, the conductive thin film being formed on each side of an insulating film;

forming a first hole through the insulating film by irradiating a laser beam by using the patterned conductive thin film as a first mask;

forming a conductive layer on the side wall of the first hole; then, patterning each conductive thin film on each side of the insulating film by photoetching simultaneously or successively, so that circuit wiring patterns on one side and a removed portion on another side are formed;

forming a second hole through said insulating film by irradiating a laser beam by using the patterned conductive thin film on another side as a second mask.

Since each conductive thin film on each side of the insulating film is patterned by photoetching simultaneously or successively so that circuit wiring patterns on one side and a removed portion on another side are formed, the steps are more simplified.

The carbon dioxide laser beam is preferably used for the laser etching because of its high speed and short time machining ability.

When the insulating film is selectively removed by irradiating the carbon dioxide laser beam, such decomposed residues may remain on the bottom surface of the hole, or the periphery surface of the copper plating layer around the hole, depending on the material of the insulating film. These decomposed residues may be a problem with the following stages, therefore, should be remove in an oxidant-containing alkali aqueous solution.

These decomposed residues of the insulating film may be totally removed and cleaned by irradiating an excimer laser beam.

The conductive layer on the side wall of the first hole comprises a conductive thin film and an acid electroplating copper layer. The combination of the direct plating layer and the photoetched plating layer improves characteristics of the plated via hole such as plate adhesion, mechanical strength, and its productivity and reliability.

The conductive thin film may be made of a material selected from the group consisting of tin-palladium mixture, tin-palladium compound mixture, graphite, conducting carbon, and conducting polymer like polypyrrole.

The patterning of one of the conductive thin films by photoetching to form circuit wiring patterns may be performed by using an electrodeposition type photoresist. Such photoresist makes it possible to form an uniform and secure photoresist layer on the wall of the hole and its vicinity. As a result, quality and accuracy of the photoetching is improved.

BRIEF DESCRIPTION OF THE DRAWINGS

The invention will be explained in more detailed in conjunction with the appended drawings, wherein:

FIGS. 7A and 7B are partially cross-sectional views similar to FIGS. 5A and 5B, but showing a double-sided circuit tape carrier during the steps in the second preferred embodiment, where a right hand half portion of the double-sided circuit tape carrier is simply shown.

DESCRIPTION OF THE PREFERRED EMBODIMENTS

Figure 1:
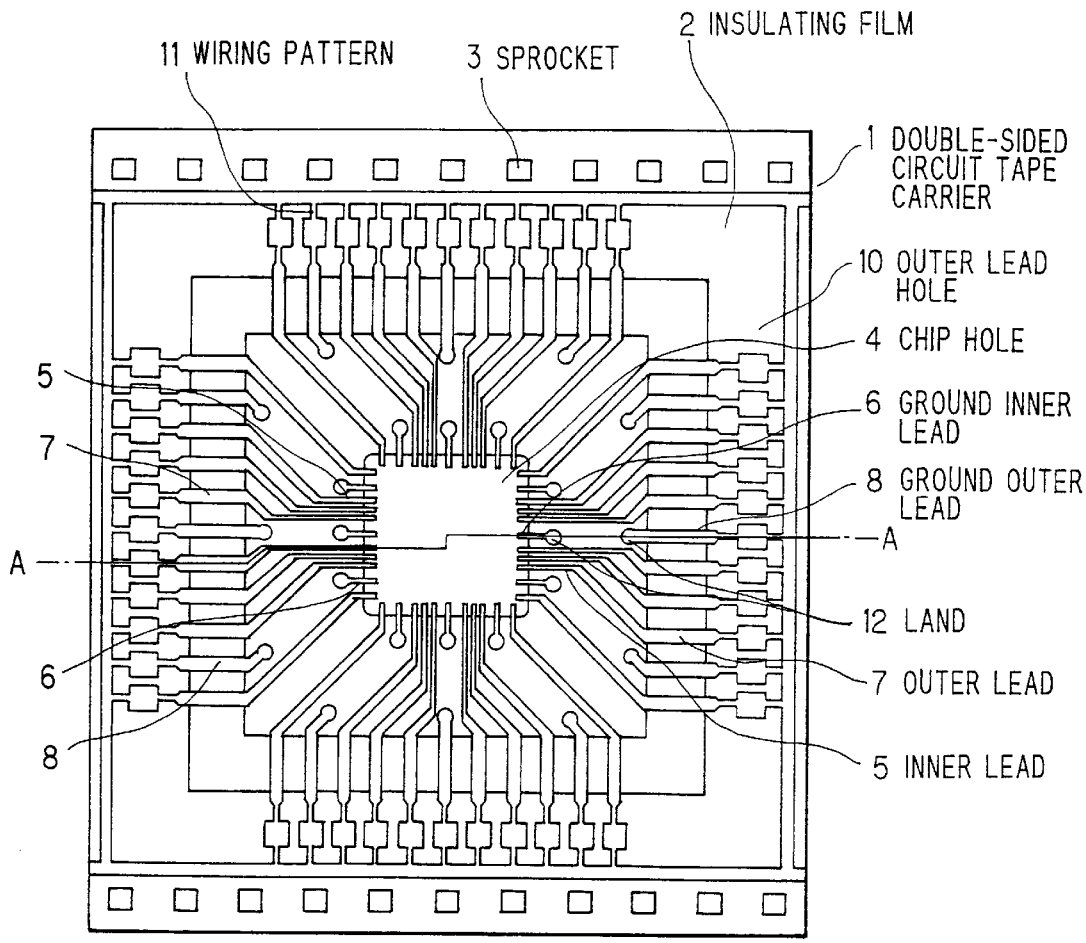
FIG. 1 is a plane view showing a conventional semiconductor device using a double-sided circuit tape carrier.
Figure 2:
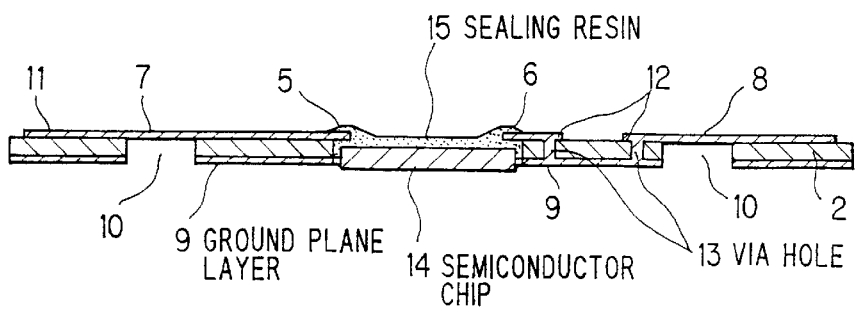
FIG. 2 is a cross-sectional view taken along the line A—A in FIG. 1, FIGS. 3A and 3B are partially cross-sectional views showing a double-sided circuit tape carrier during the steps in the conventional method, where a right hand half portion of the double-sided circuit tape carrier is simply shown.
Figure 3A:
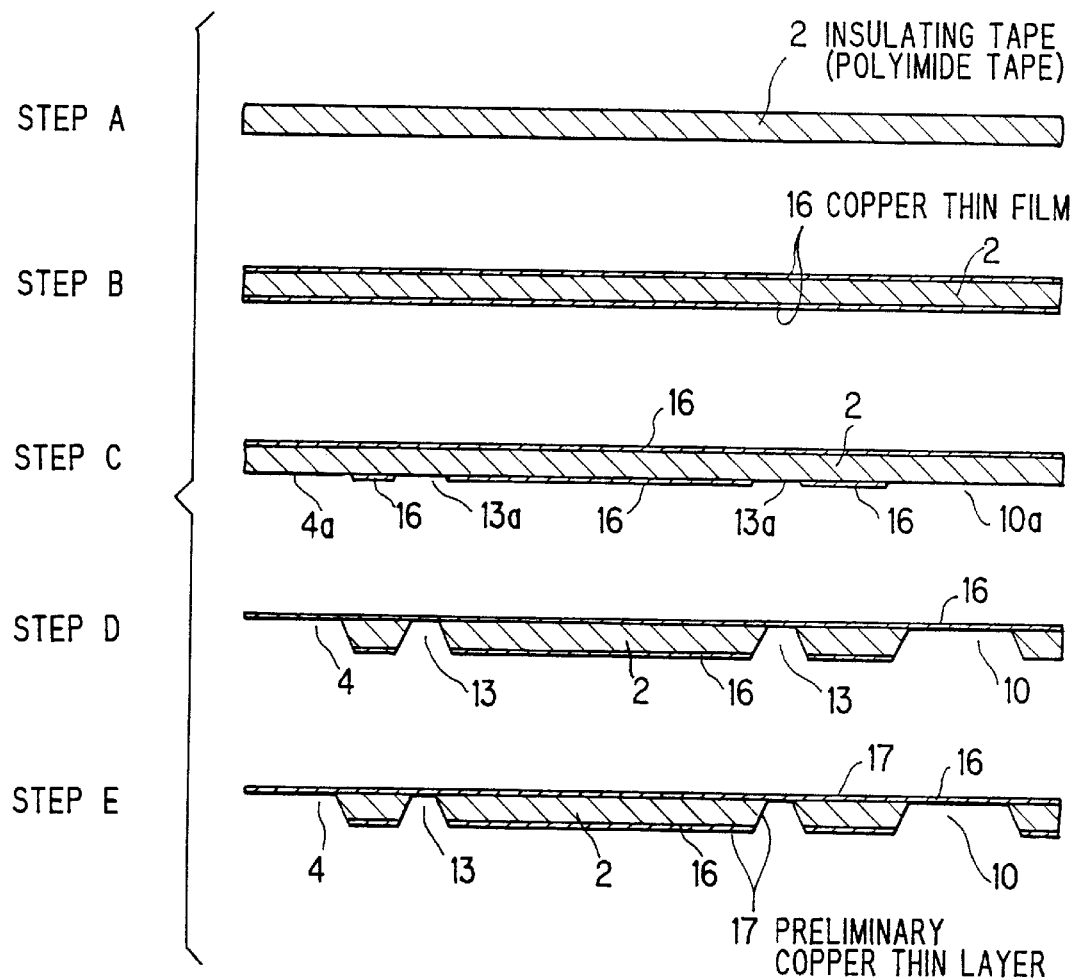
Figure 3B:
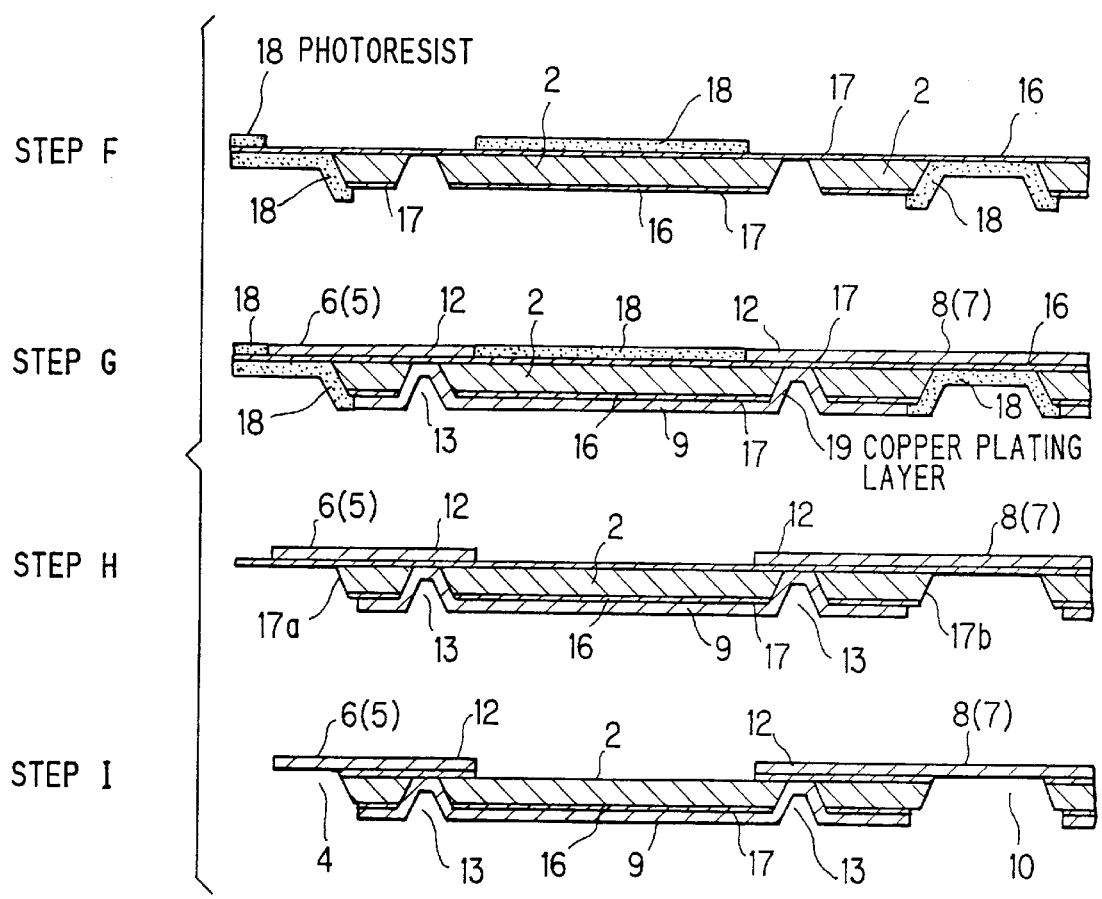
Figure 4:
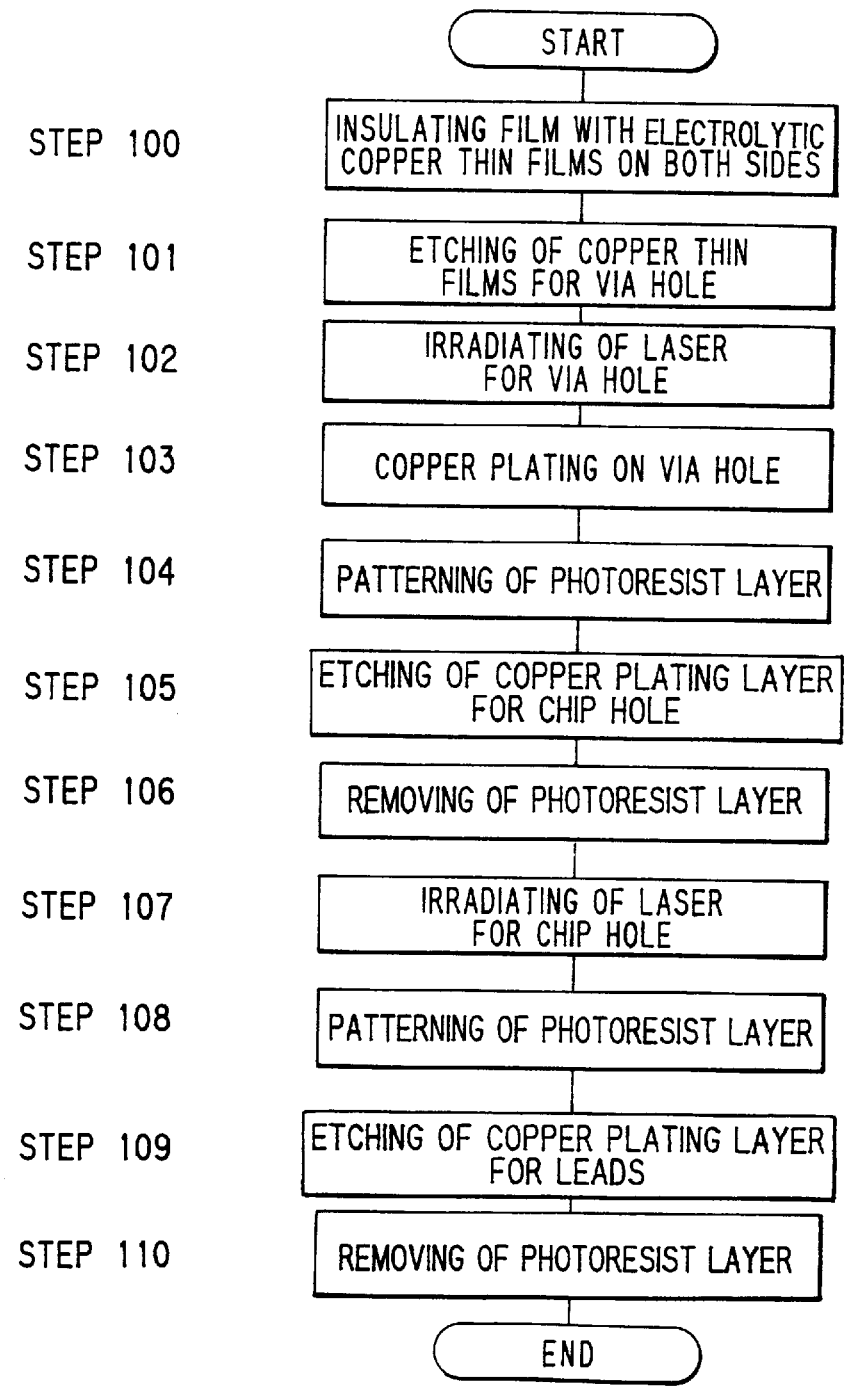
FIG. 4 is a flow chart showing a method of manufacturing a double-sided circuit tape carrier in a first preferred embodiment according to the invention.
Figure 5A:
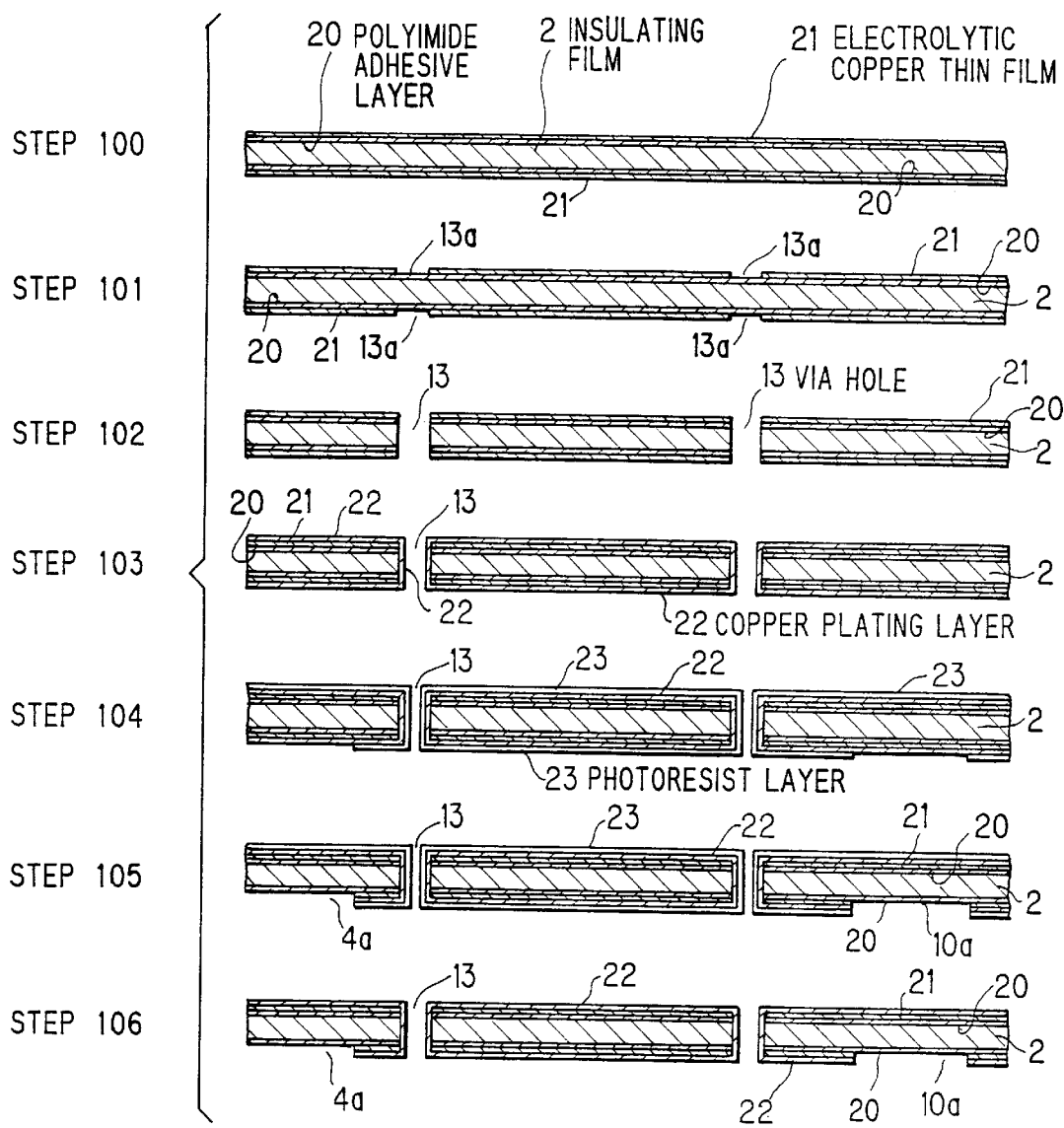
FIGS. 5A and 5B are partially cross-sectional views similar to FIGS. 3A and 3B, but showing a double-sided circuit tape carrier during the steps in the first preferred embodiment, where a right hand half portion of the double-sided circuit tape carrier is simply shown.
Figure 5B:
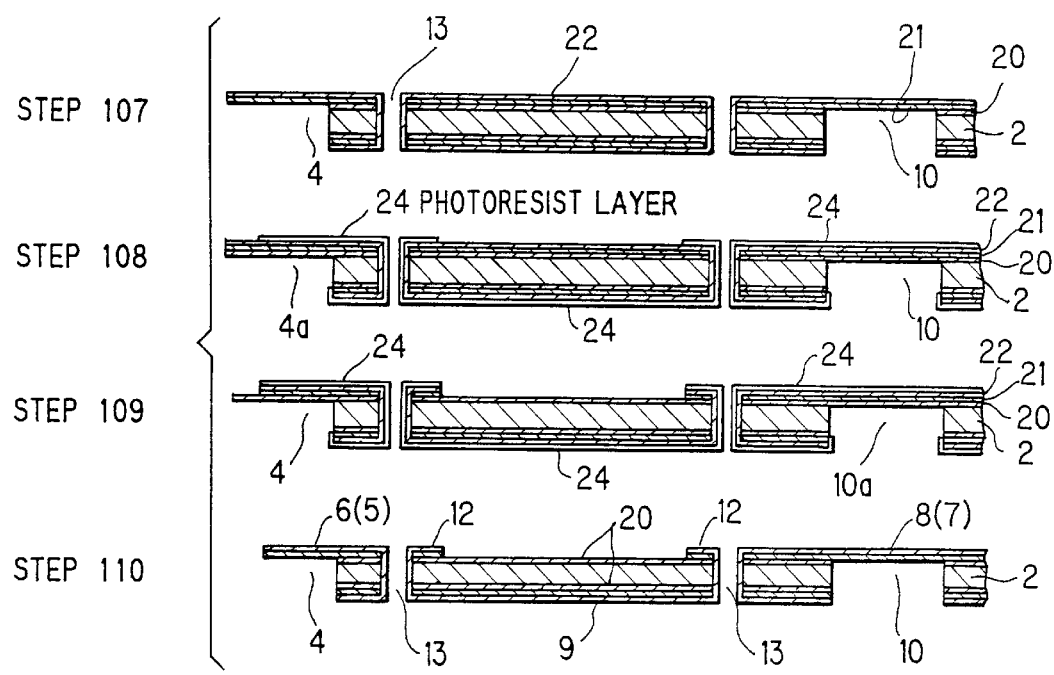

FIGS. 4, 5A, and 5B show a method of manufacturing a double-sided circuit tape carrier in the first preferred embodiment, wherein like parts are indicated by like reference numerals as used in FIGS. 1, 2, 3A and 3B.

First of all, Both sides of an insulating film 2 having a thickness of 50 $\mu$m are coated with a polyimide adhesive layer 20 having a thickness of 10 $\mu$m, then laminated by an electrolytic copper thin film 21 (STEP 100) to obtain an insulating film having double-sided copper layer. The insulating film 2 is a material which is capable of forming a hole by a laser beam and satisfies certain characteristics required for semiconductor chip mounting process and real use, such as heat resistance, chemical resistance, electric insulation or the like. For example, a polyimide tape such as "Kapton H", "Kapton V" (both produced by Toray Dupont K.K.) or the like, or a glass epoxy tape may be used.

Next, the copper thin film 21 on each side of the insulating film 2 is selectively removed by a photoetching technique to form removed portions 13a as windows for forming via holes (STEP 101). By using the patterned copper thin film 21 as a mask, the via holes 13 of 60 $\mu$m diameter are formed by irradiating a carbon dioxide laser beam through the removed portions 13a (STEP 102). The via holes 13 thus formed do not have any excessive etching below the copper thin film 21 which may occur through a conventional alkali etching technique. The carbon dioxide laser beam is preferably used for the laser etching because of its high speed and short time machining ability.

Next, the inside wall of each via hole is coated with a graphite conductive thin film (not shown) by a graphite colloid process (for example, "Shadow Process" developed by Ebara Electric Industry, K.K.), which is known as one of direct plating techniques. Besides graphite, the conductive thin film may be made of a material selected from the group consisting of tin-palladium mixture, tin-palladium compound mixture, conducting carbon, and conducting polymer like polypyrrole or the like. After that, a copper plating layer 22 of about 10 $\mu$m is formed by electroplating on both the side wall of each via hole 13 and the exposed surface of each copper thin film 21 by using a copper sulfate solution (STEP 103). Then, a positive electrodeposition type photoresist layer 23 of about 7 $\mu$m (for example, "PEPR XP-2400" made by Shipley Far East) is selectively formed on the copper plating layer 22. The photoresist layer 23 thus formed has an uniform thickness, and neither nonuniformity thereof around the via holes nor any pinhole therein is observed. A conventional liquid type photoresist is not preferable, because it is difficult to fill it into the fine via holes, and to form uniform photoresist layer.

Next, the photoresist layer 23 on one side of the insulating film 2 is selectively removed by exposing and developing to form removed portions 4a and 10a as windows through which a chip hole 4 and a outer lead hole 10 are formed afterward(STEP 104). After that, both the copper thin film 21 and the copper plating layer 22 are selectively removed by an etchant of ferric chloride aqueous solution (STEP 105). Then, the photoresist layer 23 is totally removed to obtain the patterned copper plating layer 22 having the removed portions 4a and 10a as windows (STEP 106).

Next, the insulating film 2 having double-sided copper plating layer 22 thus formed is irradiated by a carbon dioxide laser beam through the removed portions 4a and 10a so as to selectively remove the polyimide adhesive layer 20 and the insulating film (i.e., polyimide film) 21 by laser etching to form the chip hole 4 and the outer lead hole 10 (STEP 107). At this stage, the insulating film 2 having double-sided copper plating layer 22 thus formed is preferably treated in an alkali aqueous solution which contains an oxidant like permanganate (for example, a mixed aqueous solution of potassium permanganate and sodium hydroxide), so that the exposed surfaces of the copper plating layer 22 or the copper thin film 21 including the bottom surfaces of the chip holes 4 and the outer lead hole 10 are cleaned by removing possible decomposed residues of the insulating film 2. When the insulating film 2 is selectively removed by irradiating the carbon dioxide laser beam, such decomposed residues may remain on the bottom surface of the holes 4 and 10a, or the periphery surface of the copper plating layer 22 around these holes, depending on the material of the insulating film 2. These decomposed residues may be a problem with the following stages, therefore, should be remove.

After that, another positive electrodeposition type photoresist layer 24 is selectively formed on the copper plating layer 22, and is selectively removed by exposing and developing to form patterned removed portions as windows for circuit wiring patterns through which inner leads 5, ground inner leads 6, outer leads 7, ground outer leads 8 and lands 12 are formed afterward (STEP 108).

After that, both the copper thin film 21 and the copper plating layer 22 are selectively removed by an etchant of ferric chloride aqueous solution (STEP 109). Finally, the photoresist layer 24 is removed to obtain a double-side circuit tape carrier 1 (STEP 110).

Figure 6:
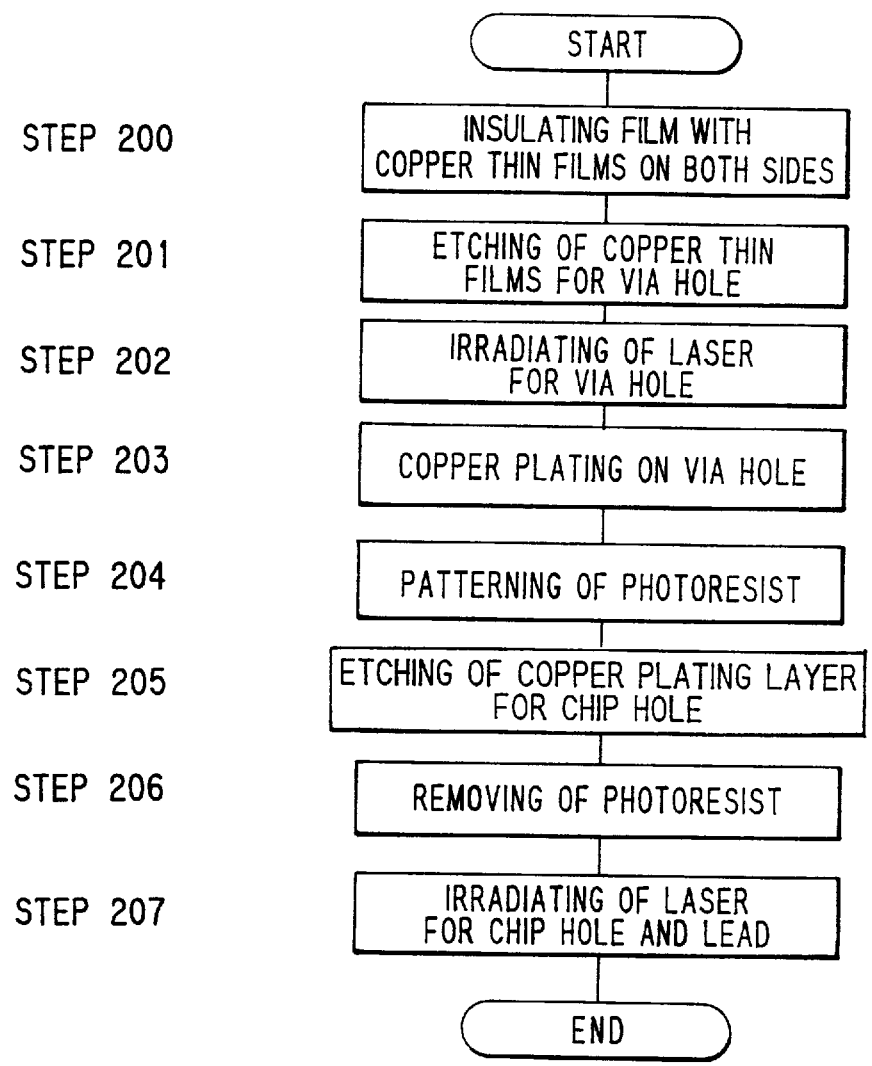
FIG. 6 is a flow chart showing a method of manufacturing a double-sided circuit tape carrier in a second preferred embodiment according to the invention.
Figure 7B:
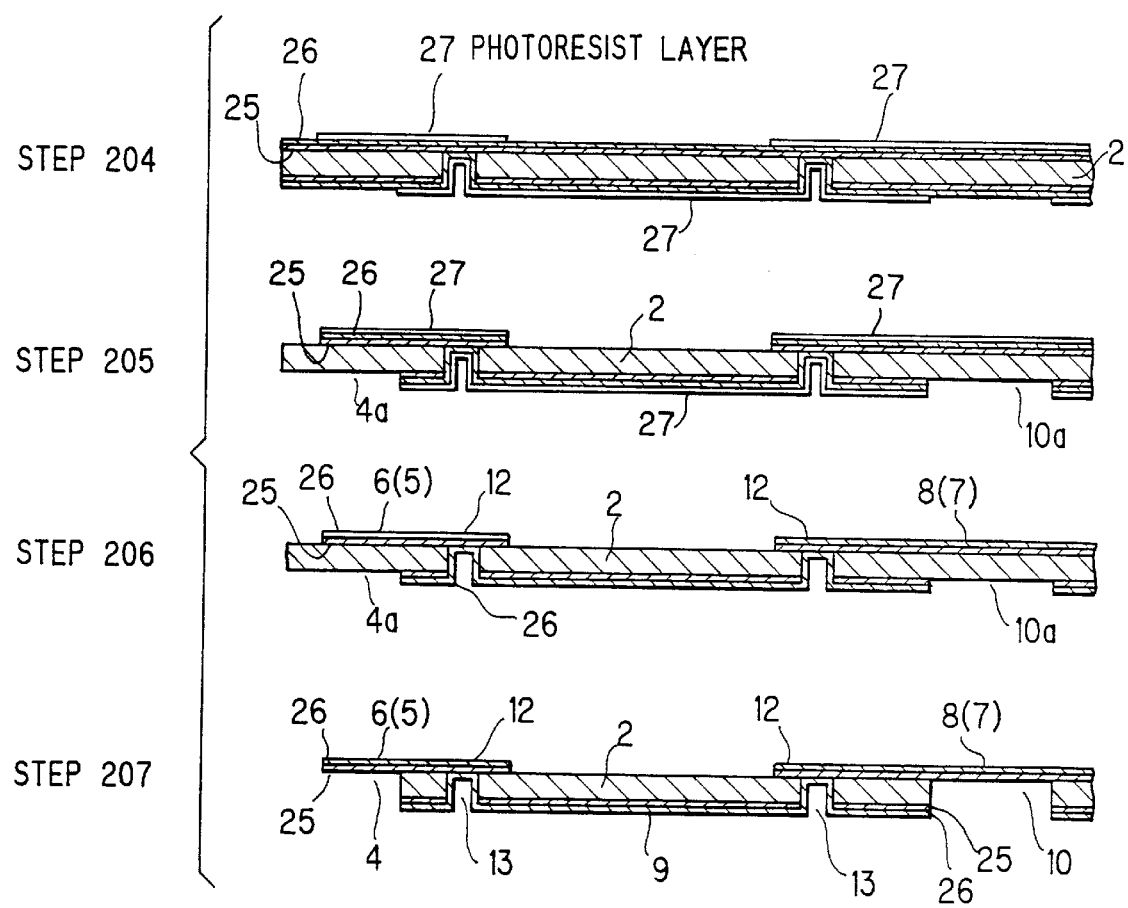

Next, a method of manufacturing a double-sided circuit tape carrier in the second preferred embodiment according to the invention will be explained in FIGS. 6, 7A and 7B, wherein like parts are indicated by like reference numerals as used in FIGS. 4 5A and 5B.

First of all, a copper thin film 25 of 5 $\mu$m thickness is formed on each side of a polyimide film (i.e., insulating film)

2 of 50 μm thickness by a plating technique (STEP 200), then, the copper thin film 25 on one side is selectively removed by a photoetching technique to form removed portions 13*a* of 50 μm diameter as windows for forming via holes 13 afterward (STEP 201). After that, the insulating film 2 is selectively removed by laser etching by irradiating a carbon dioxide laser beam through the removed portion 13*a* to form blind via holes 13*b*. The blind via holes 13*b* are via holes with their bottom ends sealed with the copper plating layer 25 on opposite side of the insulating film 2. The diameters of each blind via hole 13*b* are 50 μm at the top (opening) and about 30~40 μm at the bottom. At this stage, any excessive etching below the copper thin film 25, which may occur through a conventional alkali etching technique, is observed in the blind via holes 13 thus formed.

Next, the insulating film 2 having double-sided copper thin film 25 is treated in an alkali aqueous solution like a mixed aqueous solution of potassium permanganate and sodium hydroxide, so that possible decomposed residues of the insulating film 2 which remain on the bottom surface of the via holes 13 or the periphery surfaces of the copper thin film 25 around the via holes 13 are removed and cleaned.

Next, the inside walls of the via holes where the surface of the insulating film is exposed are coated by a conductive thin film of polypyrrole (not shown) by a conducting polymer process (for example, "DMS-2 Process" developed by Hitachi Chemical Industry, Ltd), which is known as one of direct plating techniques. After that, another copper plating layer 26 of about 10 μm is formed on both the side walls of the via holes 13 and the surface of the copper thin film 25 by electroplating using a copper sulfate solution (STEP 203).

Next, a positive electrodeposition type photoresist layer 27 of about 7 μm thickness (for example, "PEPX XP-2400" made by Shipley Far East) is selectively formed on the copper plating layer 26. The photoresist layer 27 thus formed has an uniform thickness and neither nonuniformity thereof around the via holes nor any pinhole therein is observed.

Then, the photoresist layer 27 on each side is selectively removed by exposing and developing to form patterned removed portions as windows through which a pattern of inner leads 5, ground inner leads 6, outer leads 7, ground outer leads 8, lands 12 on one side, and a pattern of a chip hole 4 and a outer lead hole 10 on opposite side are formed afterward (STEP 204). After that, both the copper thin film 25 and the copper plating layer 26 are selectively removed by an etchant of ferric chloride (STEP 205). Then, the photoresist layer 27 is removed to obtain patterned copper plating layers 26 on both sides of the insulating film 2, one of which has wiring circuit patterns of inner leads 5, ground inner leads 6, outer leads 7, ground outer leads 8, lands 12, and another has the removed portions 4*a* and 10*a* (STEP 206).

Next, the insulating film 2 having double-sided copper plating layer 26 thus formed is irradiated by a carbon dioxide laser beam through the removed portions 4*a* and 10*a*, so that the insulating film (i.e., polyimide film) 2 is selectively removed by laser etching to form a chip hole 4 and an outer lead hole 10 (STEP 107). Finally, the back side surfaces of the ground inner leads 6 (inner leads 5) and the ground outer leads 8 (outer leads 7) are irradiated by an excimer laser beam so that a possible remaining layer of decomposed residues of the insulating film thereon (organic thin film) is totally removed and cleaned (This treatment may be substituted by the treatment in an alkali aqueous solution which contains an oxidant as explained above) to obtain a double-side circuit tape carrier (STEP 207).

Although the etching rate of the insulating film 13 by the excimer laser beam is slower than that by a carbon dioxide laser beam, the layer of decomposed residues is so thin that the slower rate is not likely to affect the manufacturing efficiency.

In the second preferred embodiment, the removed portions 13*a* of the copper thin film 25 for forming the via holes 13 are provided on one side opposite to the side where the inner leads 5, the ground inner leads 6, the outer leads 7, the ground outer leads 8, and the lands 12 are formed. However, the removed portions 13*a* may be provided on the same side where the inner leads 5 and so forth are to be formed.

The double-sided circuit tape carriers manufactured by the method described in the first and second preferred embodiments according to the invention are tested, respectively. As a result, good conductivity through each the via hole and good heat resistance through a soldering float test are obtained.

Although the double-side circuit tape carriers in the first and second preferred embodiment employ usual tape carrier structure for TCP having outer leads, the invention is not limited to such structure but applicable to another tape carrier structure for BGA having lands on which ball-shaped soldering pads for electrical connection are formed.

Moreover, the circuit on one side (back side) is not limited to the ground plane layer only but may include other leads or lands for various purposes.

In the invention, the direct plating technique for plating the inside wall of the via holes by a conductive thin film may include graphite colloid process, conducting carbon colloid process or the like which make it possible to obtain the same result as explained in the preferred embodiment.

It is understood by the person skilled in the art to combine various conventional process for mounting a semiconductor chip on the double-sided circuit tape carrier or making a semiconductor device, such as plating of tin layer, solder layer, gold layer or the like, or printing a solder resist layer for ensuring insulation reliability.

Although the invention has been described with respect to specific embodiment for complete and clear disclosure, the appended claims are not to be thus limited but are to be construed as embodying all modification and alternative constructions that may be occur to one skilled in the art which fairly fall within the basic teaching here is set forth.

What is claimed is:

1. A method of manufacturing a double-sided circuit tape carrier, said double sided circuit tape carrier comprising an insulating film, circuit wiring patterns on both sides thereof, and a via hole through which at least a part of the circuit wiring patterns on both sides are electrically connected with each other, said method comprising the steps of:

patterning at least one conductive thin film by photoetching, said conductive thin film being formed on each side of an insulating film;

forming a first hole through said insulating film by irradiating a laser beam by using said patterned conductive thin film as a first mask;

forming a conductive layer on the side wall of said first hole; then, patterning one of said conductive thin films by photoetching;

forming a second hole through said insulating film by irradiating a laser beam by using said patterned conductive thin film as a second mask; then, patterning one of said conductive thin films by photoetching to form circuit wiring pattern.

2. A method of manufacturing a double-sided circuit tape carrier, according to claim 1, wherein:

said laser beam is a carbon-dioxide laser beam.

3. A method of manufacturing a double-sided circuit tape carrier, according to claim 2, wherein;

each said step of forming said first or second hole through said insulating film is followed by the step of removing decomposed residue of said insulating film by dissolving said decomposed residue into an oxidant-containing alkali aqueous solution.

4. A method of manufacturing a double-sided circuit tape carrier, according to claim 2, wherein:

each said step of forming a hole through said insulating film is followed by the step of removing decomposed residue of said insulating film by irradiating an excimer laser beam.

5. A method of manufacturing a double-sided circuit tape carrier, according to claim 1, wherein:

said conductive film on the side wall of said first hole comprises a conductive thin film and an acid electroplating copper layer, said conductive thin film being made of a material selected from the group consisting of tin-palladium mixture, tin-palladium compound mixture, graphite, conducting carbon, and conducting polymer like polypyrrole.

6. A method of manufacturing a double-sided circuit tape carrier, according to claim 1, wherein:

said patterning of one of said thin films by photoetching to form circuit wiring patterns is performed by using an electrodeposition type photoresist.

7. A method of manufacturing a double-sided circuit tape carrier, said double sided circuit tape carrier comprising an insulating film, circuit wiring patterns on both sides thereof, and a via hole through which at least a part of the circuit wiring patterns on both sides are electrically connected with each other, said method comprising the steps of:

patterning at least one conductive thin film by photoetching, said conductive thin film being formed on each side of an insulating film;

forming a first hole through said insulating film by irradiating a laser beam by using said patterned conductive thin film as a first mask;

forming a conductive layer on the side wall of said first hole; then, patterning each said conductive thin film on each side of said insulating film by photoetching simultaneously or successively, so that circuit wiring patterns on one side and a removed portion on another side are formed;

forming a second hole through said insulating film by irradiating a laser beam by using said patterned conductive thin film on another side as a second mask.

8. A method of manufacturing a double-sided circuit tape carrier, according to claim 7, wherein:

said laser beam is a carbon-dioxide laser beam.

9. A method of manufacturing a double-sided circuit tape carrier, according to claim 8, wherein:

each said step of forming said first or second hole through said insulating film is followed by the step of removing decomposed residue of said insulating film by dissolving said decomposed residue into an oxidant-containing alkali solution.

10. A method of manufacturing a double-sided circuit tape carrier, according to claim 8, wherein:

each said step of forming said first or second hole through said insulating film is followed by the step of removing decomposed residue of said insulating film by irradiating an excimer laser beam.

11. A method of manufacturing a double-sided circuit tape carrier, according to claim 7, wherein:

said conductive layer on the side wall of said first hole comprises a conductive thin film and an acid electroplating copper layer, said conductive thin film being made of a material selected from the group consisting of tin-palladium mixture, tin-palladium compound mixture, graphite, conducting carbon, and conducting polymer like polypyrrole.

12. A method of manufacturing a double-sided circuit tape carrier, according to claim 7, wherein:

said patterning of one of said conductive thin films by photoetching to form circuit wiring patterns is performed by using an electrodeposition type photoresist.

* * * * *